(12) United States Patent
Boesche et al.

(10) Patent No.: US 11,108,320 B2
(45) Date of Patent: Aug. 31, 2021

(54) METHOD AND VOLTAGE MULTIPLIER FOR CONVERTING AN INPUT VOLTAGE, AND DISCONNECTOR

(71) Applicant: ELLENBERGER & POENSGEN GMBH, Altdorf (DE)

(72) Inventors: Dirk Boesche, Seershausen (DE); Ernst-Dieter Wilkening, Braunschweig (DE)

(73) Assignee: Ellenberger & Poensgen GmbH, Altdorf (DE)

( * ) Notice: Subject to any disclaimer, the term of this patent is extended or adjusted under 35 U.S.C. 154(b) by 89 days.

(21) Appl. No.: 16/540,284

(22) Filed: Aug. 14, 2019

(65) Prior Publication Data

US 2019/0372459 A1    Dec. 5, 2019

Related U.S. Application Data

(63) Continuation of application No. PCT/EP2018/051267, filed on Jan. 19, 2018.

(30) Foreign Application Priority Data

Feb. 14, 2017   (DE) .......................... 102017202348.1
Mar. 10, 2017   (DE) .......................... 102017204044.0

(51) Int. Cl.
*H02M 3/07*   (2006.01)
*H01H 9/30*   (2006.01)
(Continued)

(52) U.S. Cl.
CPC .............. *H02M 3/073* (2013.01); *H01H 9/30* (2013.01); *H01H 9/542* (2013.01); *H02H 7/20* (2013.01);
(Continued)

(58) Field of Classification Search
CPC .... H01H 2009/544; H01H 9/30; H01H 9/542; H02H 7/20; H02H 9/041; H02M 1/08;
(Continued)

(56) References Cited

U.S. PATENT DOCUMENTS 5,798,985 A   8/1998 Nakajima
5,926,013 A   7/1999 Brandt
(Continued)

FOREIGN PATENT DOCUMENTS

CN   1246984 A    3/2000
CN   101840296 A  9/2010
(Continued)

*Primary Examiner* — Jared Fureman
*Assistant Examiner* — Nicolas Bellido
(74) *Attorney, Agent, or Firm* — Laurence A. Greenberg; Werner H. Stemer; Ralph E. Locher

(57) ABSTRACT

An input voltage is converted into a higher output voltage by several voltage stages each having a series circuit with a rectifier diode, a charging capacitor, and a switchable first semiconductor switch. Each voltage stage has a switchable second semiconductor switch is connected in parallel with the rectifier diode and the charging capacitor. The rectifier diodes of adjacent voltage stages are connected in series. First, the first semiconductor switches are closed and the second semiconductor switches are opened, to charge the charging capacitors by the input voltage. Then, the first semiconductor switches are opened and the second semiconductor switches are closed, so that the individual voltages produced on the charging capacitors add up along the series-connected rectifier diodes to produce the output voltage.

11 Claims, 8 Drawing Sheets

(51) Int. Cl.
  *H01H 9/54* (2006.01)
  *H02H 7/20* (2006.01)
  *H02S 40/32* (2014.01)

(52) U.S. Cl.
  CPC ........ *H01H 2009/544* (2013.01); *H02S 40/32* (2014.12)

(58) Field of Classification Search
  CPC .. H02M 1/32; H02M 1/36; H02M 2001/0006; H02M 3/07; H02M 3/073; H02S 40/32; H03K 17/063; H03K 2217/0081
  See application file for complete search history.

(56) References Cited

U.S. PATENT DOCUMENTS

| | | | |
|---|---|---|---|
| 7,075,356 B2 | 7/2006 | Mayama et al. | |
| 7,079,363 B2 | 7/2006 | Chung | |
| 8,212,541 B2 * | 7/2012 | Perreault | H02M 3/155 323/282 |
| 8,493,131 B2 | 7/2013 | Mo et al. | |
| 8,742,828 B2 | 6/2014 | Naumann et al. | |
| 8,817,501 B1 * | 8/2014 | Low | H02M 3/07 363/60 |
| 8,963,630 B2 | 2/2015 | Ceballos et al. | |
| 9,054,576 B2 * | 6/2015 | Kang | H02M 3/07 |
| 9,521,716 B2 | 12/2016 | Kovatchev et al. | |
| 9,608,535 B2 * | 3/2017 | Kawamura | H02M 1/4233 |
| 10,607,792 B2 * | 3/2020 | Wilkening | H01H 9/542 |
| 10,680,513 B2 * | 6/2020 | Giuliano | H02M 3/07 |
| 2002/0008568 A1 | 1/2002 | Sugimura | |
| 2007/0210774 A1 * | 9/2007 | Kimura | H02M 3/073 323/282 |
| 2014/0268936 A1 | 9/2014 | Lu et al. | |
| 2015/0035512 A1 | 2/2015 | Kim et al. | |
| 2017/0229256 A1 * | 8/2017 | Wilkening | H02H 3/20 |
| 2019/0229615 A1 * | 7/2019 | Sanders | H02M 3/156 |

FOREIGN PATENT DOCUMENTS

| | | | |
|---|---|---|---|
| CN | 102349124 A | | 2/2012 |
| CN | 202841003 U | * | 3/2013 |
| CN | 103516332 A | | 1/2014 |
| CN | 104798306 A | | 7/2015 |
| CN | 105207256 A | * | 12/2015 |
| DE | 19638616 A1 | | 5/1997 |
| DE | 10315982 A1 | | 11/2003 |
| DE | 10225259 B3 | | 1/2004 |
| DE | 102004007182 A1 | | 9/2004 |
| DE | 202008010312 U1 | | 11/2008 |
| DE | 102011001774 A1 | | 10/2012 |
| EP | 1544694 A1 | | 6/2005 |
| JP | S5630590 U | | 3/1981 |
| JP | H08106839 A | | 4/1996 |
| WO | 2010108565 A1 | | 9/2010 |
| WO | 2016062427 A1 | | 4/2016 |

* cited by examiner

METHOD AND VOLTAGE MULTIPLIER FOR CONVERTING AN INPUT VOLTAGE, AND DISCONNECTOR

CROSS-REFERENCE TO RELATED APPLICATION

This application is a continuation, under 35 U.S.C. § 120, of copending international application No. PCT/EP2018/051267, filed Jan. 19, 2018, which designated the United States; this application also claims the priority, under 35 U.S.C. § 119, of German patent application No. 10 2017 202 348.1, filed Feb. 14, 2017 and German patent application No. 10 2017 204 044.0, filed Mar. 10, 2017; the prior applications are herewith incorporated by reference in their entirety.

BACKGROUND OF THE INVENTION

Field of the Invention

The invention relates to a method of converting an input voltage into an output voltage that is higher than the input voltage. In addition, the invention relates to a voltage multiplier operated according to such a method and to a disconnecting apparatus equipped with such a voltage multiplier for interrupting direct current between a DC source and an electrical device. In this context, a DC source refers in particular to a photovoltaic generator (PV generator, solar system) and an electrical device refers in particular to an inverter.

German utility model DE 20 2008 010 312 U1 and its corresponding international patent application WO 2010/012629 A2 disclose a photovoltaic system (PV system) with a so-called photovoltaic generator; that system in turn consists of photovoltaic modules grouped into component generators, which in turn are connected in series or are present in parallel strands. The direct current output of the photovoltaic generator is fed into an AC grid via an inverter. Because a PV system or solar system is desired that provides a permanent operating current and an operating voltage in the range between 180 V (DC) and 1500 V (DC), in addition to a reliable isolation of the electrical components or devices from the PV system that acts as a DC source—for example for installation, assembly or service purposes, and in particular also for general personal protection—a corresponding disconnecting apparatus must be able to carry out an interruption under load, in other words, without switching off the DC source beforehand.

A mechanical switch (switching contact) may be used for the purpose of load isolation, so that it is advantageous to implement galvanic isolation of the electrical device (inverter) from the DC source (PV system) when the contact has been opened. If, in contrast, load isolation-capable semiconductor switches are used for load isolation, unavoidable power losses occur at the semiconductor switches even during normal operation. Furthermore, power semiconductor switches of this kind do not provide galvanic isolation and therefore do not provide reliable personal protection.

German patent DE 102 25 259 B3 discloses an electrical connector designed as a load isolator, having a hybrid-type semiconductor switch in the form of a thyristor in the housing of the inverter as well as main and auxiliary contacts that are connected to PV modules. The main contact, which leads the unplug process, is connected in parallel with the auxiliary contact, which is lagged and connected in series with the semiconductor switch. The semiconductor switch is controlled so as to prevent or quench electric arcs by periodically switching it on and off.

A hybrid electromagnetic DC switch, with an electromagnetically actuated main contact and an IGBT (insulated gate bipolar transistor) as a semiconductor switch, may also be used for interrupting direct current (cf., U.S. patent application US 2003/0193770 A1 and German published patent application DE 103 15 982 A2). However, such a hybrid switch has an external energy source for operating power electronics with a semiconductor switch.

Commonly assigned U.S. patent application US 2012/0007657 A1 and its counterpart international patent application WO 2010/108565 A1 describe a hybrid disconnector with a mechanical switch or disconnecting element and semiconductor electronics connected in parallel with it, these electronics substantially comprising at least one semiconductor switch, preferably an IGBT. In this case, the semiconductor electronics has no additional energy source and when the mechanical switch is closed, it is current-blocking, i.e. practically free of current or voltage. The semiconductor electronics obtain the energy required for operation from the disconnecting apparatus, i.e. from the disconnector system itself, using the energy of the arc generated when the mechanical switch is opened. In this case, the semiconductor electronics are connected to the mechanical switch on the gate side in such a way that when the switch opens, the arc voltage, as a result of the arc formed via the switching contacts, switches the semiconductor electronics to be current-conducting.

As soon as the semiconductor electronics are switched to be conducting, the arc current from the mechanical switch to the semiconductor electronics begins to be commutated. The corresponding arc voltage or arc current charges an energy store in the form of a capacitor, which discharges while generating a control voltage, specifically in order to switch off the semiconductor switch in an arc-free manner. The given duration or time constant, and thus the charging time of the energy store or capacitor, determines the arc duration. Following the charging process, a timer starts during which the semiconductor electronics are controlled so as to conduct current in an arc-free manner. The duration of the timer is set so that the arc may safely be extinguished.

Such arc-fed hybrid switches have the problem that the arc voltage must first reach or exceed a specified voltage so that the at least one IGBT of the semiconductor electronics is reliably controlled so as to short-circuit the switching path. The time required for this voltage rise causes additional wear on the mechanical (switching) contacts.

SUMMARY OF THE INVENTION

It is accordingly an object of the invention to provide a voltage multiplier method which overcomes the above-mentioned and other disadvantages of the heretofore-known devices and methods of this general type and which provides for a particularly suitable method of converting an input voltage into an output voltage that is higher than the input voltage. An additional object of the invention is to specify a voltage multiplier that may be operated according to such a method, as well as a disconnecting apparatus equipped with such a voltage multiplier for interrupting direct current between a DC source, in particular a photovoltaic generator, and an electrical device, in particular an inverter. In particular, it should be possible to achieve the highest possible switching capacity and, in particular, the highest possible control speed, thus enabling very fast control of the power electronics of the disconnecting apparatus.

With the foregoing and other objects in view there is also provided, in accordance with the invention, a method for converting an input voltage into an output voltage that is increased in comparison to the input voltage. The method comprises:

providing a plurality of voltage stages each having a series circuit connected to a reference potential and including a rectifier diode, a charging capacitor, and a switchable first semiconductor switch; and each of the voltage stages having a switchable second semiconductor switch connected in parallel with the rectifier diode and the charging capacitor, and the rectifier diodes of mutually adjacent voltage stages being connected in series;

closing the first semiconductor switches and opening the second semiconductor switches, to thereby charge the charging capacitors of the voltage stages by way of the input voltage; and subsequently opening the first semiconductor switches and closing the second semiconductor switches, to sum individual voltages generated in the charging capacitors over the series-connected rectifier diodes and to produce the output voltage.

With the above and other objects in view there is also provided, in accordance with the invention, a voltage multiplier that is configured to carry out the above-summarized method. The voltage multiplier comprises:

a plurality of voltage stages each having a series circuit connected to a reference potential, the series circuit including a rectifier diode, a charging capacitor, and a first semiconductor switch that is switchable by a control unit, wherein the a control unit is configured to control at least one voltage stage that provides an individual voltage;

each voltage stage having a second semiconductor switch connected to and switchable by the control unit, the second semiconductor switch being connected in parallel with the rectifier diode and the charging capacitor; and the rectifier diodes of adjacent voltage stages being connected in series.

The method according to the invention is suitable and designed for converting an input voltage into an output voltage that is higher than the input voltage. For this purpose, a number of voltage stages are furnished between an input side and an output side according to the method, and each stage respectively has a series circuit connected to a reference potential. The series circuits respectively comprise a rectifier diode and a charging capacitor as well as a switchable first semiconductor switch between the charging capacitor and the reference potential. A second switchable semiconductor switch is respectively connected in parallel with the rectifier diode and the charging capacitor, and the rectifier diodes of adjacent voltage stages are connected in series with one another.

In a first step, the first semiconductor switches are closed, and thus are electrically conductive, and the second semiconductor switches are opened, i.e. switched to become electrically non-conductive or blocking. As a result, due to the input voltage, a current flows via the rectifier diodes to the reference potential, so that the charging capacitors of the voltage stages are charged by means of the input voltage. As a result, a respective individual voltage is generated at the charging capacitors. In this case, the charging capacitors of the voltage stages are effectively connected in parallel.

Next, in a subsequent second step, the first semiconductor switches are opened and the second semiconductor switches are closed. As a result, the charging capacitors are connected in series along the rectifier diodes, so that the individual voltages generated at the charging capacitors, and the input voltage at the output side of the voltage stages, are added to the output voltage. As a result, a method is realized that is particularly suitable for converting an input voltage into an output voltage that is higher than the input voltage.

By means of the method according to the invention, it is possible to convert an almost arbitrarily low input voltage into an almost arbitrarily high output voltage, by suitably dimensioning the number of voltage stages and the charging capacitors thereof. The method thus makes it possible to control MOS or IGBT semiconductor switches in a safe and reliable manner, even at low input voltages, by means of the output voltage that may be generated. In particular, it is thus possible to reduce switching delay times.

In a preferred application, the method according to the invention is carried out by means of a voltage multiplier. The voltage multiplier is particularly suitable and designed for a disconnecting apparatus for interrupting direct current. The voltage multiplier comprises a control unit for carrying out the above-described method. The control unit here controls at least one, and preferably at least two, voltage stage(s), each of which respectively provides an individual voltage.

Each voltage stage has a series circuit, connected against a reference potential, of a rectifier diode and a charging capacitor as well as a first semiconductor switch that is switchable by means of the control unit. In addition, a second semiconductor switch, which is switchable by means of the control unit, is connected in parallel with the rectifier diode and the charging capacitor in each voltage stage. The rectifier diodes of adjacent voltage stages are connected in series.

With the voltage multiplier according to the invention, it is possible to rapidly convert a comparatively low input voltage to a comparatively high output voltage. Particularly when used in a disconnecting apparatus, the output voltage provided within a short period of time enables a high switching capacity and thus a high control speed, and consequently very fast control of the power electronics of the disconnecting apparatus.

For example, the control unit comprises a controller, i.e. a control device. This controller—in terms of programming and/or circuitry—is generally suitable and designed for carrying out the above-described method. The controller is thus specifically designed to first close the first semiconductor switches and open the second semiconductor switches, so that the charging capacitors of the voltage stages are charged by means of the input voltage, and then to open the first semiconductor switches and close the second semiconductor switches, so that the individual voltages generated at the charging capacitors, along the rectifier diodes connected in series, add up to the output voltage.

In one possible configuration, the controller is formed at least in its core by a microcontroller with a processor and a data store, in which the functionality for carrying out the method is implemented programmatically in the form of an operating software (firmware), so that the method—if necessary in interaction with a user—is automatically carried out when the operating software is executed in the microcontroller.

Without departing from the scope of the invention, the controller may alternatively also be formed by a non-programmable electronic component, for example an ASIC (application-specific integrated circuit), in which the functionality for carrying out the method is implemented by means of circuitry.

In a preferred embodiment, the control unit is designed purely as circuitry, i.e. without a controller or control device, and the method is carried out automatically when an input voltage is present. This has an advantageous effect on the manufacturing costs of the voltage multiplier. Furthermore, the reliability and switching delay time of the voltage multiplier is improved, which is particularly advantageous for use in a disconnecting apparatus for interrupting direct current.

In a suitable refinement, a capacitor is connected upstream of the control unit on the input side of the voltage stages, i.e. at a terminal point that is coupled to the input voltage. In the charged state, the capacitor activates the first semiconductor switches of the voltage stages. This ensures reliable control of the first semiconductor switches.

In one advantageous design, a Zener diode of the control unit is connected in parallel to the charging capacitor and the second semiconductor switch on the output side, i.e. at a terminal point at which the output voltage may be tapped. If the charging capacitor of the output side voltage stage is charged in order to generate the individual voltage, the Zener diode conducts, and a third semiconductor switch of the control unit is gated in such a way that the first semiconductor switches of the voltage stages open. As a result, the first semiconductor switches are reliable opened at the end of the first step.

In an expedient configuration, a voltage divider connected in parallel with the series circuit is furnished for gating the second semiconductor switch of the respective voltage stage. The tap point of the voltage divider, in this case, is connected to a control input of the second semiconductor switch. After opening the first semiconductor switches, a current flows across the voltage divider due to the input voltage, so that the voltage generated at the tap point is used to reliably gate the second semiconductor switches. This ensures that the second semiconductor switches close reliably at the beginning of the second step.

In a preferred embodiment, the or each first semiconductor switch is designed as a MOSFET (metal-oxide-semiconductor field-effect transistor), which is connected on the drain side to the charging capacitor and on the source side to the reference potential. The or every second semiconductor switch is designed as a bipolar transistor that is connected in parallel along the collector-emitter path of the rectifier diode and the charging capacitor and is connected on the base side to a gate terminal of the first semiconductor switch. This realizes a particularly expedient embodiment of the first and second semiconductor switches with regard to the circuit-based gating by means of the control unit.

The disconnecting apparatus according to the invention, also referred to below as a hybrid switch, is arranged between a DC source and an electrical device, for the purpose of interrupting direct current. The hybrid switch has a current-carrying mechanical switch and power electronics connected to it, as well as a power supply that is charged by means of an arc voltage that is generated as a result of an arc at the switch when the switch opens.

The hybrid switch further comprises a pulse generator that is connected to the power supply and is also referred to in the following as a pulse generator circuit. The pulse generator gates at least one semiconductor switch of the power electronics in such a way that the power electronics short-circuits the mechanical switch while extinguishing the arc, which leads to an extinguishing of the arc. To reduce the switching delay time of the semiconductor switch of the power electronics, a voltage multiplier according to the invention is connected between the power supply and the pulse generator. The voltage multiplier converts the input voltage that the power supply generates into an output voltage suitable for controlling the pulse generator or pulse generator circuit.

In an advantageous configuration, the voltage multiplier is connected on the input side to an energy store of the power supply. The energy store is charged by means of the arc voltage generated by the arc, and this energy is fed to the voltage multiplier as input voltage. In an expedient refinement, the pulse generator (the pulse generator circuit) has a semiconductor switch connected to the output of the voltage multiplier, and this switch is caused to become conductive when the output voltage of the voltage multiplier reaches a voltage value that is or may be set, which is also referred to below as the operating voltage. This semiconductor switch of the pulse generator is suitably implemented as a thyristor.

In a suitable refinement, the power electronics tap a control pulse, preferably generated from the operating voltage, on the gate side of a voltage tap that is arranged downstream of this semiconductor switch of the pulse generator. In other words, via this voltage tap the pulse generator is connected to the gate side of the power electronics, i.e. to at least one semiconductor switch on the gate side, so that when the control pulse or control signal of the pulse generator is present it is activated, i.e. switched to be conducting, and short-circuits the mechanical switch, in particular its switch contacts or corresponding contact connections. Preferably, the pulse generator generates only one control pulse per switching operation, i.e. one individual pulse. Due to the voltage multiplier, the time required to generate the individual pulse is substantially reduced, so that the wear on the switch contacts due to the arc is reduced.

The invention is based on the consideration that by means of the pulse generator controlled by the voltage multiplier, which preferably generates only one individual pulse per switching operation, a very fast gating of the power electronics of a hybrid disconnecting apparatus is achieved, and thus the switching capacity of the apparatus is particularly high, i.e. greater than known disconnecting apparatuses.

The disconnecting apparatus according to the invention may suitably be furnished for interrupting direct currents preferably in the DC voltage range up to 1500 V (DC). In the preferred use of the additional mechanical disconnector, this self-sufficient, hybrid disconnecting apparatus is therefore particularly suitable for reliable and safe galvanic DC interruption both between a photovoltaic system and an associated inverter, and also in connection with a fuel cell system or a battery, for example.

Other features which are considered as characteristic for the invention are set forth in the appended claims.

Although the invention is illustrated and described herein as embodied in a method and voltage multiplier for converting an input voltage, and a corresponding disconnector, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL
VIEWS OF THE DRAWING

DETAILED DESCRIPTION OF THE INVENTION

Figure 1:
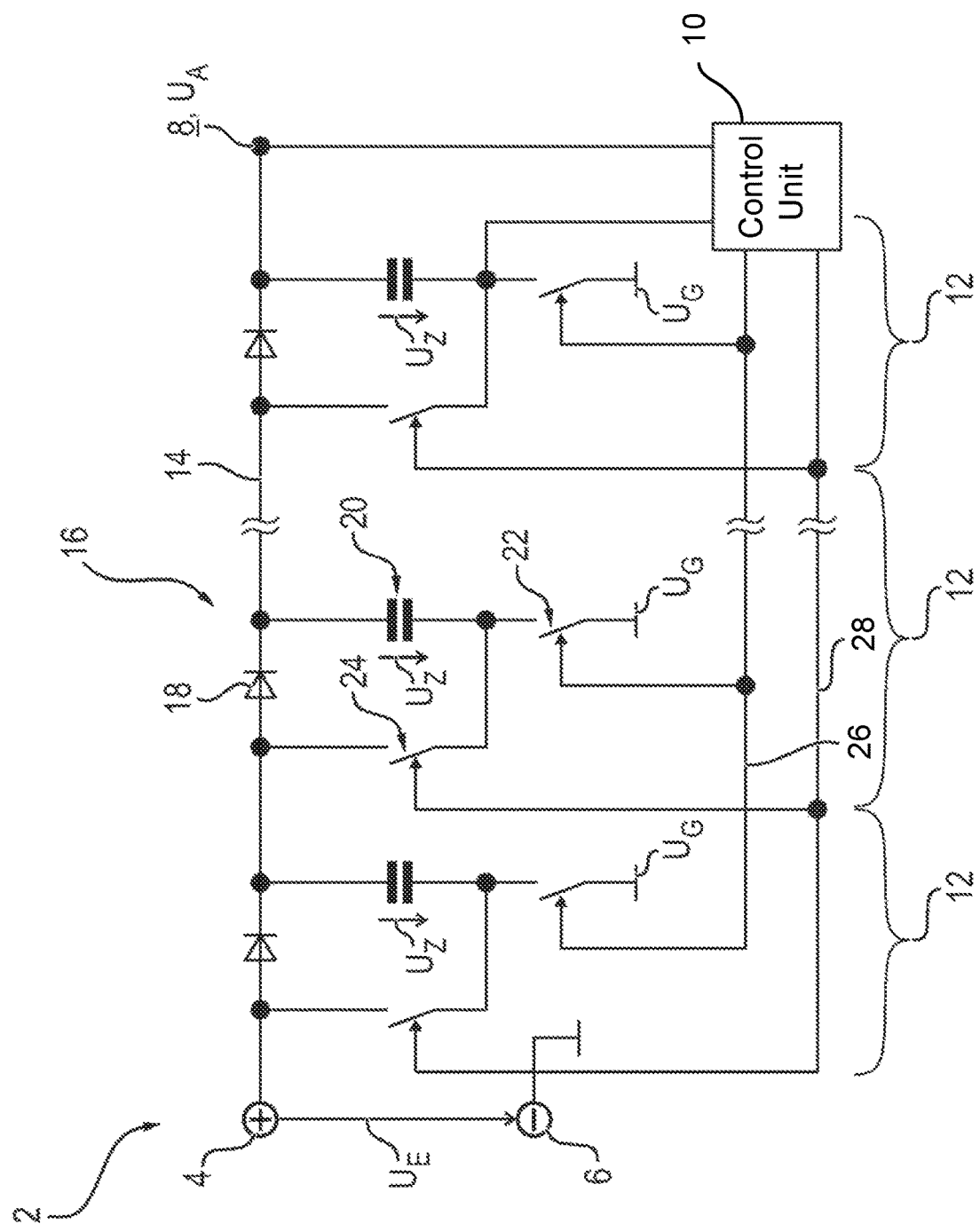
FIG. 1 is a schematic circuit diagram of a voltage multiplier with a number of voltage stages.

Referring now to the figures of the drawing in detail and first, particularly, to FIG. 1 thereof, there is shown a schematic depiction of a voltage multiplier 2 for converting an input voltage $U_E$ into an output voltage $U_A$ that is higher than the input voltage. The input voltage $U_E$ is on the input side between a first terminal connection or positive pole 4 and a second terminal connection or negative pole 6, and the output voltage $U_A$ may be tapped at a tap point 8.

The voltage multiplier 2 has a control unit 10, for example in the form of a controller. The control unit 10 is connected for signaling purposes with a number of voltage stages 12 that are connected in parallel between the terminal connections 4, 6 and the tap point 8. FIG. 1 shows three such voltage stages 12 by way of example.

A line 14 extends between the positive pole 4 and the tap point 8, and the voltage stages 12 are connected in parallel with each other along this line. Each voltage stage 12 has a series circuit 16 wherein a rectifier diode 18 and a charging capacitor 20 as well as a switchable first semiconductor switch 22 are connected along the line 14. In other words, the rectifier diodes 18 of adjacent voltage stages 12 are connected in series with each other along the line 14. The series circuit 16 is led to a reference potential $U_G$, which in the exemplary embodiment of FIG. 1 is ground potential. A switchable second semiconductor switch 24 is connected to the respective voltage stage 12 parallel to the rectifier diode 18 and the charging capacitor 20. For better clarity, FIG. 1 shows only the switching components for one of the voltage stages 12 with assigned reference symbols.

The semiconductor switches 22 of the voltage stages 12 may be gated by the control unit 10 by means of a first signal line 26. By means of a second signal line 28, the semiconductor switches 24 are signal-connected to the control unit 10.

During operation, the voltage multiplier 2 is supplied with the input voltage $U_E$ via the terminal connections 4 and 6. The control unit 10 controls the semiconductor switches 22 and 24 of the voltage stages 12 according to the below-described method according to the invention.

At the outset, the control unit 10 closes the semiconductor switches 22 by means of the signal line 26, while the control unit 10 opens the semiconductor switches 24 by means of the signal line 28. In other words, the semiconductor switches 22 are switched to be conductive and the semiconductor switches 24 are switched to be blocking. As a result, the charging capacitors 20 of the voltage stages 12 along the line 14 are respectively switched between the positive pole 4 and the reference potential $U_G$. As a result, the charging capacitors 20 of the voltage stages 12 are connected in parallel to each other, so that they are charged to a respective individual voltage $U_Z$ via the rectifier diodes 18.

During operation, the control unit 10 monitors the individual voltage Uz (charging voltage) generated at the charging capacitor 20 on the output side, i.e. at the charging capacitor 20 of the voltage stage 12 closest to the tap point 8. If this individual voltage $U_Z$ reaches or exceeds a preset or stored threshold voltage, the control unit 10 opens the semiconductor switches 22 and closes the semiconductor switches 24. As a result, the charging capacitors 20 previously connected in parallel are now connected in series along the line 14. Thus, the output voltage $U_A$ at the tap point 8 is a sum of the individual voltages $U_Z$ of the charging capacitors 20. Depending on the number of voltage stages 12, it is possible to generate an output voltage $U_A$ that is almost any arbitrary multiple of the input voltage $U_E$.

In the following, an example of the use of a or the voltage multiplier 2 in a disconnecting apparatus 30 is described in greater detail with reference to FIGS. 2 to 8.

Figure 2:
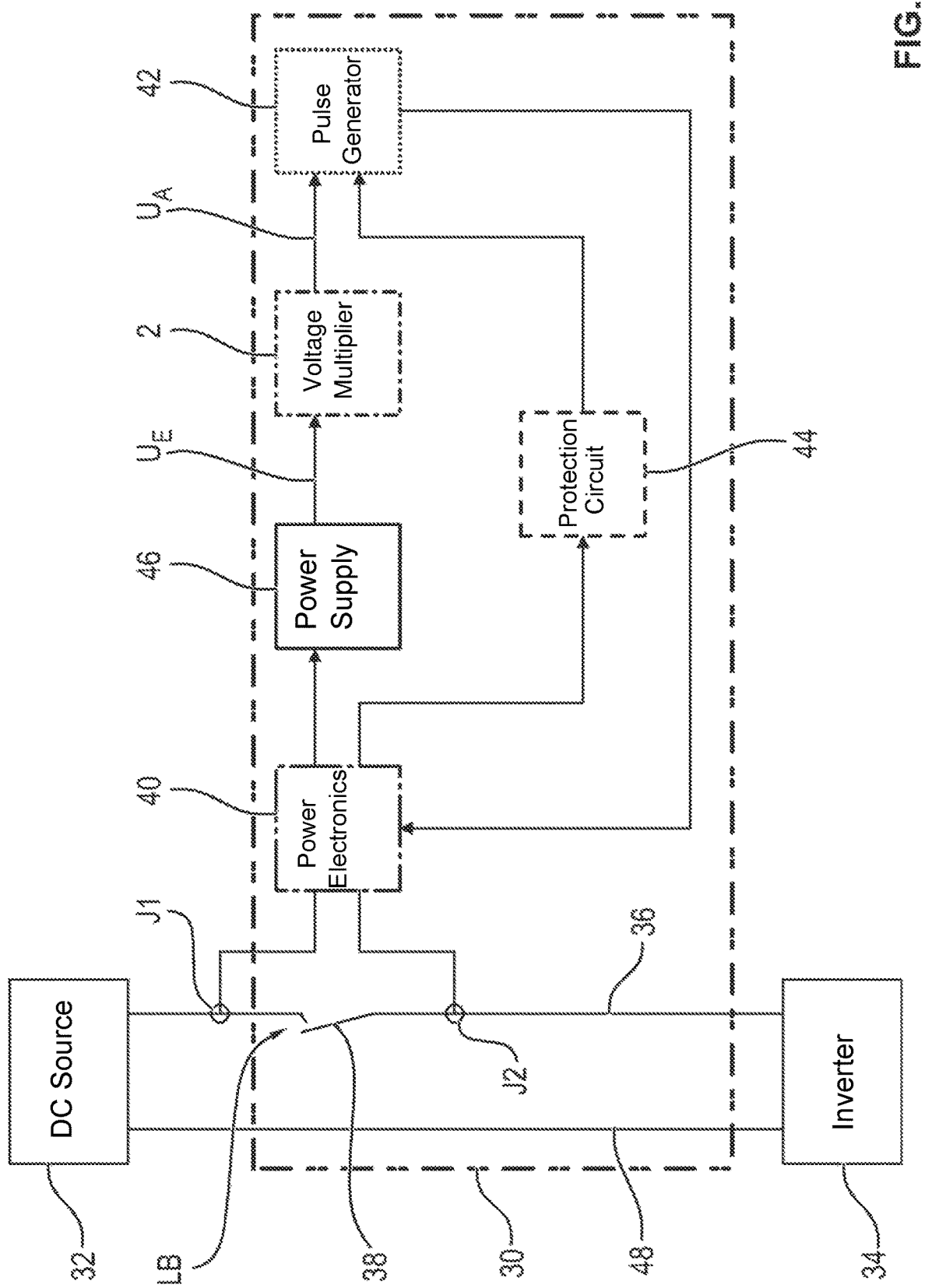
FIG. 2 is a block diagram of a hybrid disconnecting apparatus arranged between a photovoltaic generator and an inverter with a mechanical switch, power electronics including a protective circuit, and also a pulse generator, voltage multiplier and power supply.

FIG. 2 schematically depicts a disconnecting apparatus 30, which in this exemplary embodiment is connected between a DC source 32, specifically a photovoltaic generator, and an electrical device 34, specifically an inverter. The photovoltaic generator 32 may comprise, in a manner and type not otherwise shown, a number of solar modules that are connected in parallel with each other to a shared generator connection box that serves as an energy collection point.

In a main current path 36 representing the positive pole, the disconnecting apparatus 30 comprises a switching contact 38, hereinafter also referred to as a mechanical switch, and power electronics 40 connected in parallel therewith, as well as a pulse generator 42 that gates the power electronics. The disconnecting apparatus 30 further comprises a protective circuit 44 and a power supply 46. The voltage multiplier 2 is connected between the power supply 46 and the pulse generator 42.

The mechanical switch 38 and the power electronics 40, together with the pulse generator 42, form an autonomous hybrid disconnector (hybrid switch). An additional hybrid disconnector may be connected, in a manner that is not illustrated, on a feedback line 48 representing the negative pole of the disconnecting apparatus 30—and thus of the entire system. Mechanically coupled switching contacts of an additional mechanical isolating element for complete galvanic isolation or DC interruption between the photovoltaic generator 32 and the inverter 34 may be arranged both in the feed line (main path) 36 representing the positive pole and in the feedback line 48, in a manner that is not illustrated.

If the current-carrying mechanical switch 38 is then opened during operation, an arc LB forms between its switching contacts. A capacitor C9 (FIGS. 3 and 7) is charged as an energy store, via the switch terminals J1 and J2 shown in FIG. 3, by means of the resulting arc voltage.

The charging voltage of the capacitor C9 is fed to a terminal connection 50 of voltage multiplier 2 as the input voltage $U_E$. By means of this input voltage $U_E$, the voltage multiplier 2 generates an output voltage $U_A$ that is higher than the input voltage. As soon as the output voltage $U_A$ reaches a certain value, the pulse generator 42 gates the power electronics 40 so that they short-circuit the switch 38 and extinguish the arc LB.

Figure 3:
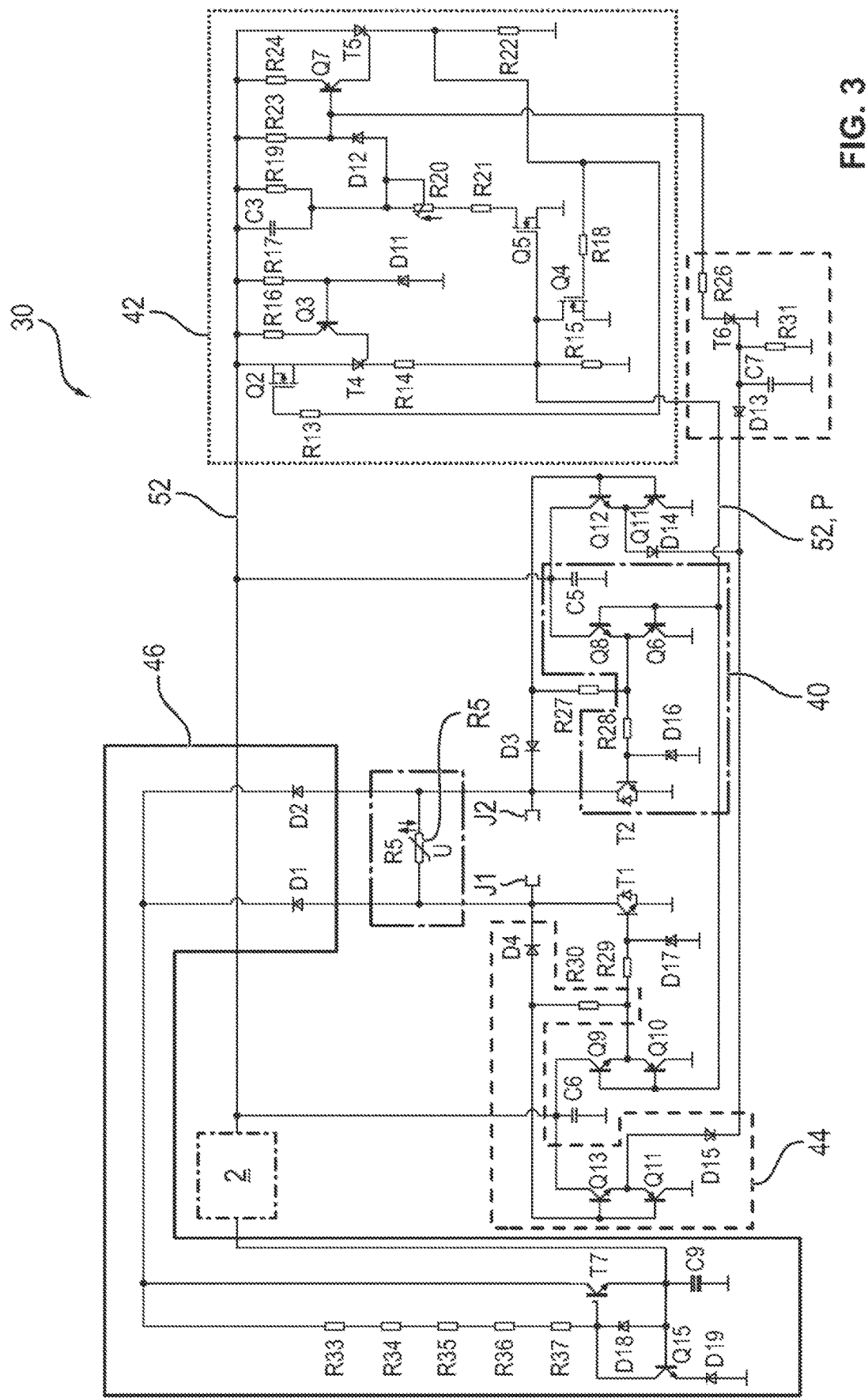
FIG. 3 is a detailed circuit diagram of the disconnecting apparatus with two semiconductor switches of the power electronics and the driver and protective circuits thereof, additionally with the pulse generator and voltage multiplier, and additionally with the power supply with a capacitor as energy store.
Figure 5:
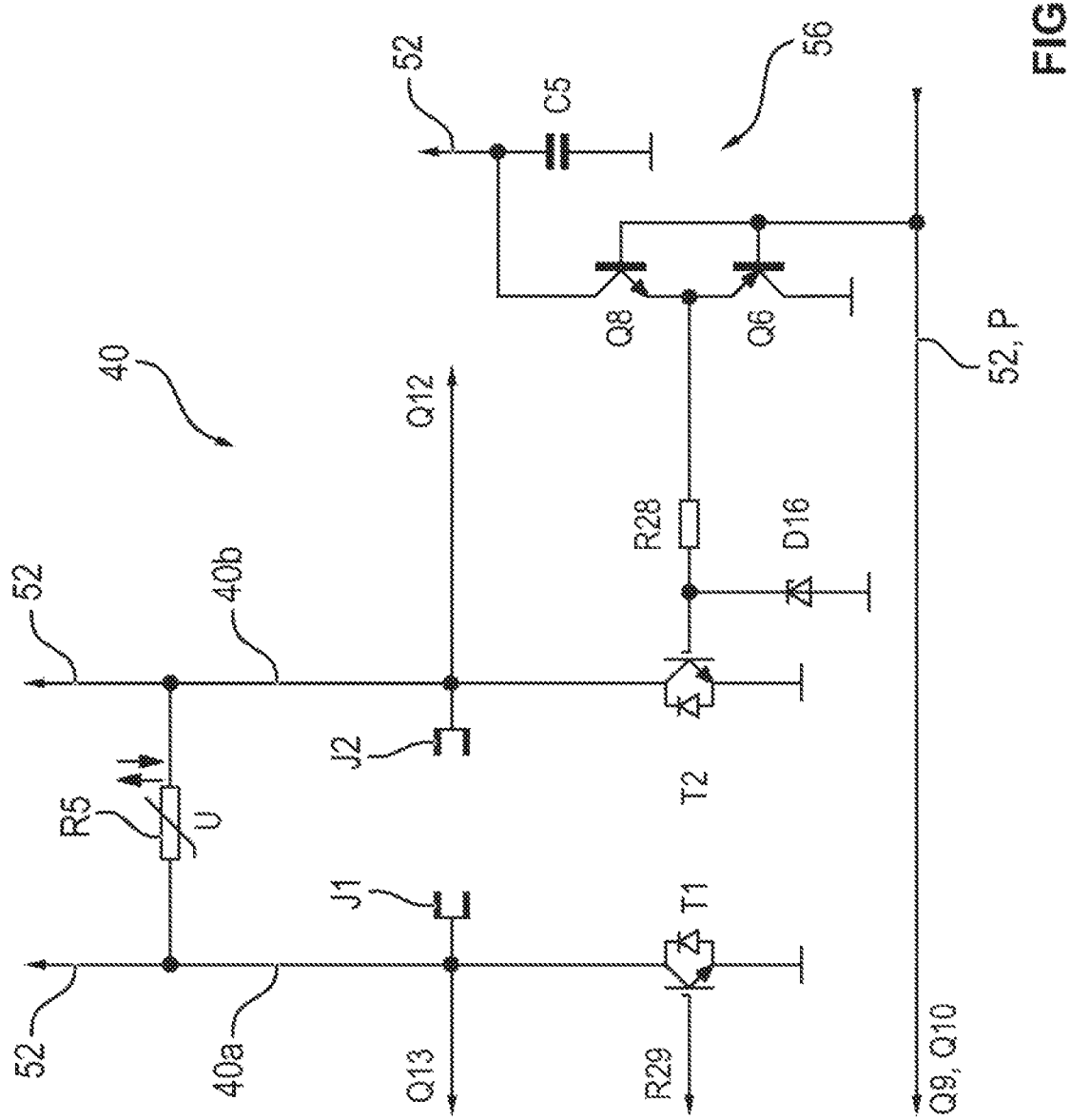
FIG. 5 shows the power electronics with a driver output stage of one of the semiconductor switches as well as two contact connections of the mechanical switch as a component circuit of the hybrid disconnecting apparatus.

In this case, the power electronics 40 suitably remain switched on for a certain period of time, i.e. for a timer period that is or may be set, so that the switching path may be deionized. After the time span or the corresponding timer period has elapsed, the pulse generator 42 switches off the power electronics 40. An overvoltage occurring during the switching process is limited by at least one varistor R5 (FIGS. 3 and 5). The protective circuit 44 monitors a respective power semiconductor (IGBT) T1, T2 of the power electronics 40 during the switching process in order to prevent it from being destroyed by an impermissibly high current.

FIG. 3 shows the disconnecting apparatus 30 in the detailed circuit diagram, and the different line types used in FIG. 2 frame the components of the power electronics 40, the pulse generator 42, the voltage multiplier 2, the protective circuit 44 and the power supply 46. Because the power electronics 40 preferably have two semiconductor switches in the form of the depicted IGBTs T1 and T2, two protective circuits 44 and two driver circuits are respectively furnished for the IGBTs T1 and T2. For reasons of clarity, in this case, respectively only one of these circuits and the components thereof is bordered with the corresponding line type. The individual component circuits are shown separately in FIGS. 4 to 7.

Figure 4:
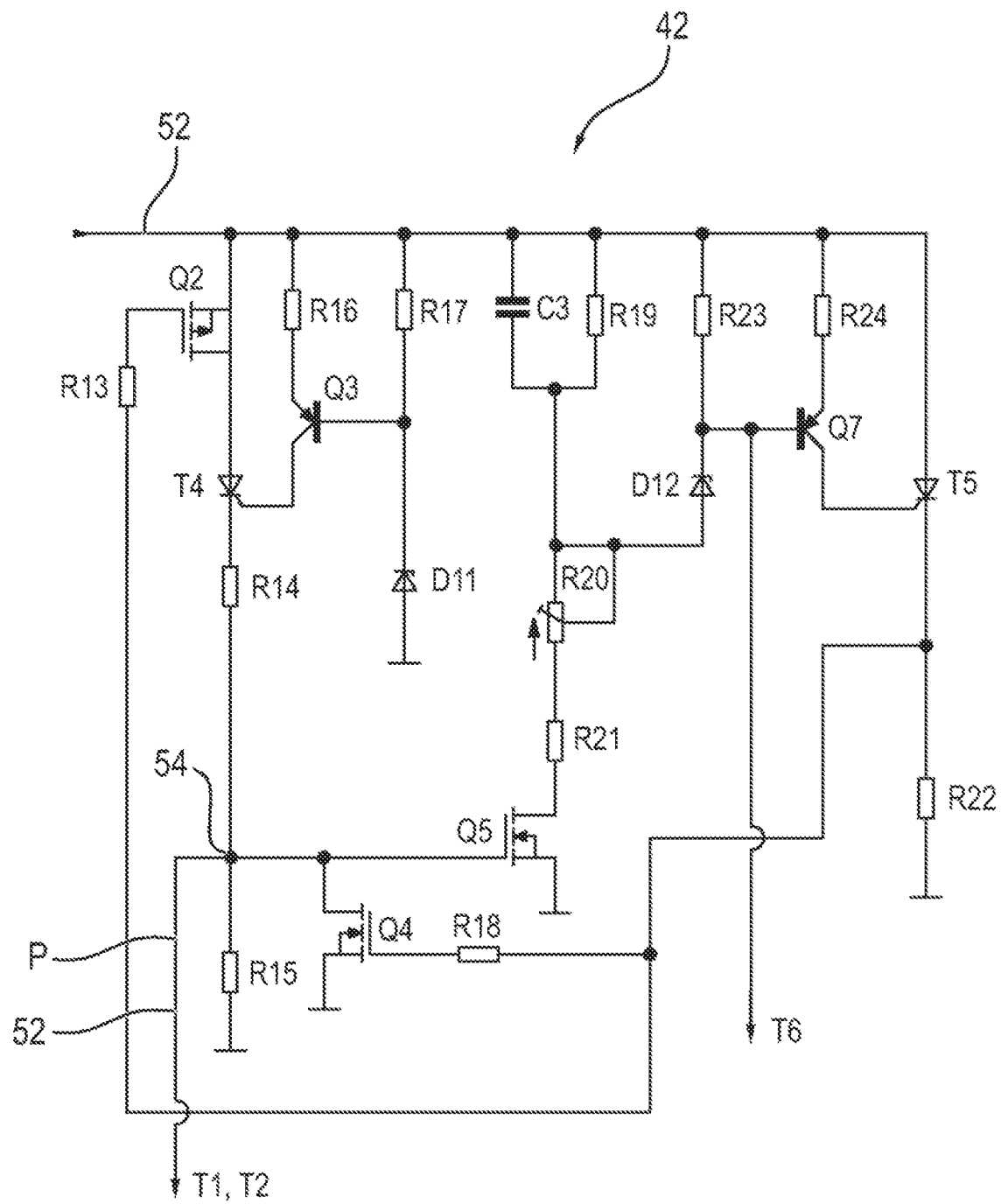
FIG. 4 shows the pulse generator as a component circuit of the hybrid disconnecting apparatus.

According to FIGS. 3 and 4, the pulse generator 7 comprises a semiconductor switch in the form of a thyristor T4 connected to the capacitor C9 via a connection 52, the thyristor being connected on the anode side to the connection 52 leading to the capacitor C9 via a PMOS transistor (P-channel metal oxide semiconductor transistor) Q2, i.e. via the collector-emitter path thereof. The thyristor T4 is connected on the gate side via a PMOS transistor Q3 that is connected to resistors R16 and R17 and to a Zener diode D11. The thyristor T4 is connected on the cathode side to a voltage tap 54 via a resistor R14, which is connected to ground via a resistor R15. In addition, the voltage tap 54 is connected to ground (reference potential) via the drain-source path of another transistor Q4, here a MOS or NMOS transistor. The voltage tap 54 also houses the base or gate of another transistor (MOS or NMOS transistor) Q5, the drain-source path of which is connected via resistors R19, R20 as variable resistor and R21 and a capacitor C3 connected in parallel to resistor R19 between the connection 52 leading to capacitor C9 and the ground.

Parallel to the RC element R19 and C3 there is a series circuit consisting of a resistor R23 and a Zener diode D12, to which the base of a PNP transistor Q7 is connected on the cathode side. The gate side of an additional thyristor T5 is connected via the transistor Q7 and a resistor R24 to the connection 52 that connects to the capacitor C9. The anode-cathode path of the thyristor T5 is connected between the connection 52 leading to the capacitor C9 and—via a resistor R22—to ground. A cathode side tap of this thyristor T5 is connected to the gate (base) of the transistor Q4 via a resistor R18 and to the gate (base) of the transistor Q2 via a resistor R13. In addition to the semiconductor switch T4, the circuit shown and described represents an appropriately wired semiconductor circuit of the pulse generator 42. The pulse generator 42 generates the or each control pulse P for the two IGBTs T1, T2 of the power electronics 6, as explained below.

The two thyristors T4 and T5 of the pulse generator 42 are in the blocking state at the beginning, and thus the gate of the transistor Q2 is at ground potential. If, as a result of an arc LB generated when the mechanical switch 5 is opened, the charging voltage of the capacitor C5 arising due to the output voltage of the voltage multiplier 2 and thus the operating voltage rises, then the negative gate source voltage of the transistor Q2 will also rise so that the transistor switches through and the anode of the thyristor T4 has the potential of the operating voltage. If this voltage rises further, the Zener diode D1 begins to transition to the conductive state. The resulting current flow causes a voltage drop at resistor R17. If this voltage drop exceeds the threshold value of the base-emitter voltage of the transistor Q3, it becomes conductive. To protect the transistor Q3 from destruction, the current is limited by the resistor R16. This current causes the thyristor T4 to fire. The value of the resistor R14 is substantially smaller than that of the resistor R15, so that the potential between these two resistors R14, R15 at the voltage tap 54 at which the control pulse P for the power electronics 6 is tapped, is only slightly below the operating voltage.

As soon as the thyristor T4 has fired, the transistor Q5 switches through and the capacitor C3 is charged via the resistors R20 and R21. Because the capacitor C3 is initially uncharged, the potential of the anode of the Zener diode D12 is at the operating voltage. As a result of the capacitor C3 charging, the potential shifts to ground. If this potential has dropped to such an extent that the Zener diode D12 becomes conductive, a current flows through resistor R23. If the voltage drop across resistor R23 exceeds the threshold base-emitter voltage of the PNP transistor Q7, that transistor switches through. The resistor R24 here limits the current and protects the transistor Q7.

The current flowing through the transistor Q7 causes the thyristor T5 to fire, so that the potential at the thyristor's cathode rises to the operating voltage—minus the forward voltage. Thus the transistor Q4 also switches through and drops the potential between the resistors R14 and R15 at the voltage tap S1 to ground. In addition, the transistor Q2 now blocks, eliminating the thyristor T4. The transistor Q5 then also blocks, and the capacitor C3 is discharged via the resistor R19. The thyristor T5 remains conductive until the capacitor C9 is discharged. Because the capacitor C9 is recharged during a light ground phase and also during the switching overvoltage, only a single control pulse is triggered. The power electronics 40 shown in FIGS. 3 and 5 are associated with a driver stage 56. The IGBTs T1 and T2 of the power electronics 40 form the lower part of a B2 rectifier bridge. By using two power semiconductors with a free-wheeling diode in the form of the IGBTs T1 and T2, a bidirectionally-capable circuit is achieved. If the illustrated switch or contact terminal J2 of the mechanical switch 38 has a positive potential and the other switch terminal J1 has a negative potential, the current may flow through the IGBT T2 and the free-wheeling diode of the IGBT T1. If the polarity is reversed, current may flow through the IGBT T1 and the free-wheeling diode of the IGBT T2. Because the control signal of an IGBT has no influence on its inverse operation, both IGBTs T1 and T2 of the power electronics 40 are always controlled.

Because the driver circuits 56 of both IGBTs T1 and T2 are identical, only one of the two driver circuits 56 is described below. The driver circuit 56 comprises an NPN transistor Q8 and a PNP transistor Q6, which are connected to a complementary output stage. If the pulse generator 42 sends the control pulse P to the bases of the two transistors Q6 and Q8, these transistors act as current amplifiers and enable rapid recharging of the gate of the respective IGBT T2, T1. As a result, a particularly fast switching process is achieved. A capacitor C5 of the driver circuit 56 provides the recharging current. The IGBT T2 is damped by a resistor R28, because parasitic inductances and capacitances may cause oscillations during gating of the respective IGBT T2. A Zener diode D16 of the driver circuit 11 protects the gate of the IGBT T2 against overvoltages, in the event that fluctuations nonetheless occur. Because overvoltages may occur when switching inductive loads due to the steep switching edge of the IGBT T2, the varistor R5 limits the overvoltage to prevent destruction of the power semiconductors T1 and T2.

Figure 6:
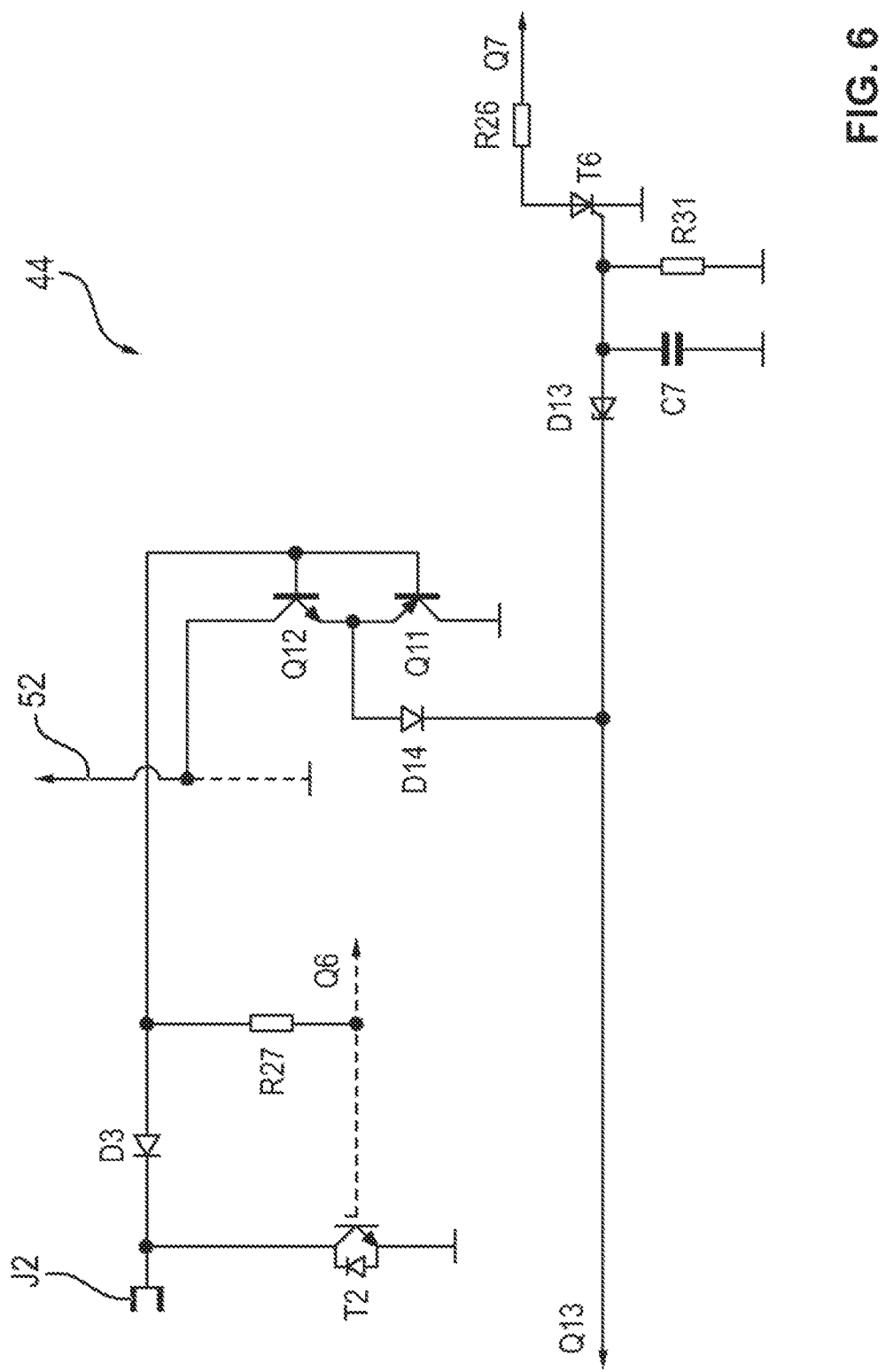
FIG. 6 shows the protective circuit with a measuring circuit for overcurrent detection as a component circuit of the hybrid disconnecting apparatus.

FIGS. 3 and 6 show the measuring and protection circuit 44 of the disconnecting apparatus 30. Although IGBTs, as semiconductor switches of the power electronics 40, are in principle short-circuit-proof, in the event of a fault they must nonetheless be switched off within 10 ps. The circuits 44 for monitoring or measuring the current of the two IGBTs T1, T2 are identically constructed, so FIG. 6 shows only one such circuit 44. The measuring circuit substantially comprises a series circuit of a resistor R27 and a diode D3, which is/are connected between the gate and the collector of the IGBT T2. The control signal of the IGBT T2 is fed to its collector-emitter path via the resistor R27 and the diode D3.

The potential between the diode D3 and the resistor R27 corresponds to the forward voltage of the IGBT T2, plus the saturation voltage of the diode D3. Thus, based on the IGBT characteristic, the current flow through this power semiconductor T2 may be determined. The resistor R27 is relatively high-impedance so as not to unnecessarily strongly discharge the capacitor C9, which serves as an energy store, during the switching phase. In order to nonetheless enable rapid switch-off in the event of a fault, a complementary output stage with correspondingly connected transistors Q11 and Q12 is connected downstream. A diode D14 connected to the output stage on the emitter side enables the parallel connection of the two measuring circuits D3, R27 and D4, R28 (FIG. 3).

A thyristor T6 of the protective circuit 44 will fire if the collector-emitter voltage of the IGBT T2 exceeds a specified potential. As a result, the transistor Q7 of the pulse generator (pulse generator circuit) 42 is then activated, initiating the switch-off process. A capacitor C7 connected to ground on the gate side of the thyristor T6, and a resistor R31 connected in parallel to this capacitor, form a filter to prevent, among other things, tripping of the protective circuit 44 during the switch-on phase of the IGBT T2. The tripping voltage may be ascertained by the following formula:

$$U_{CE}(T2) \geq U_{BE}(Q12)+U_D(D14)+U_Z(D13)+U_{zü}(T6)-U_D(D3),$$

where $U_{CE}$ is the collector-emitter voltage, $U_{BE}$ is the base-emitter voltage, $U_D$ is the forward voltage, $U_Z$ is the Zener voltage and $U_{zü}$ is the firing voltage.

Figure 7:
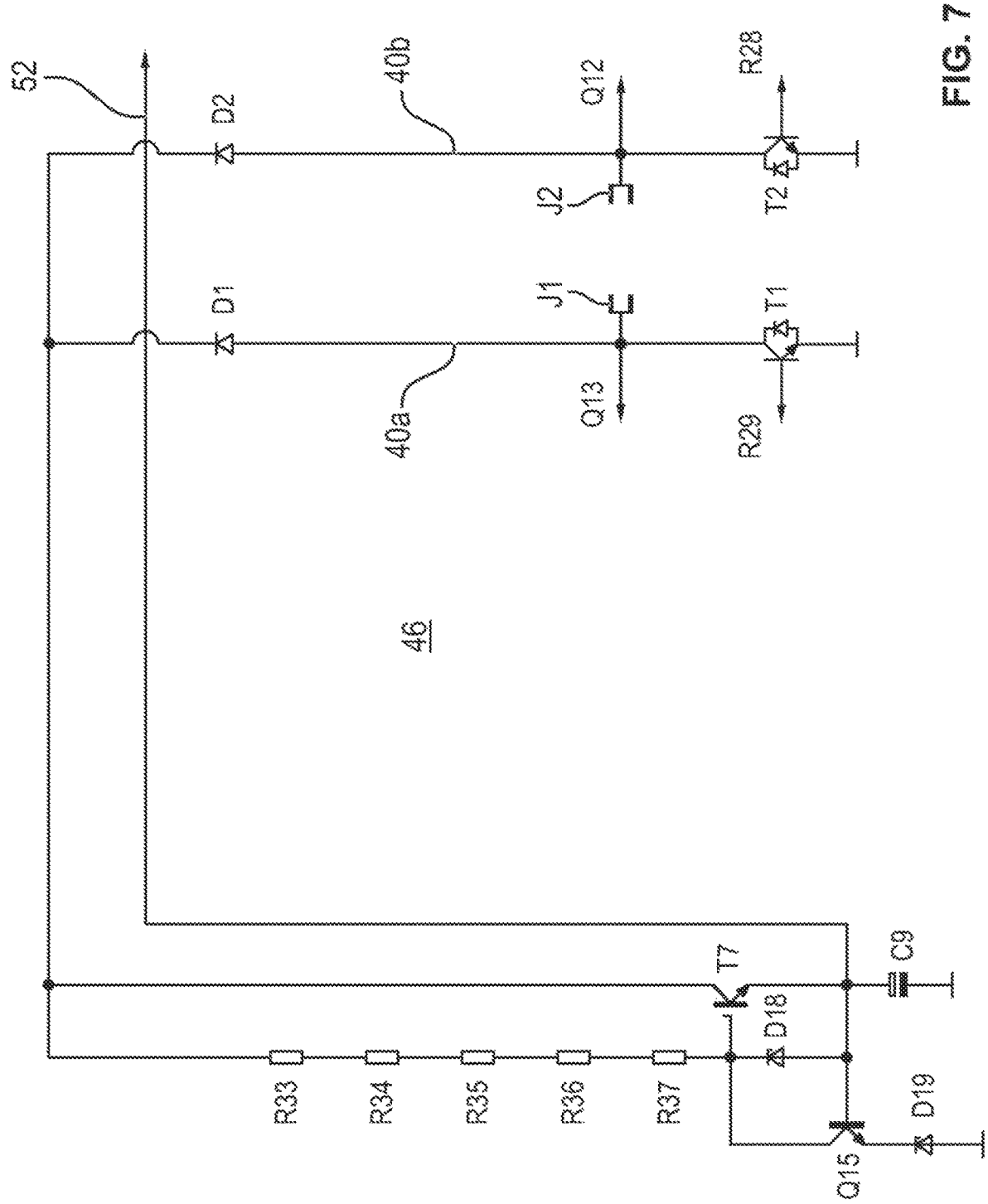
FIG. 7 shows the power supply with a rectifier circuit as a component circuit of the hybrid disconnecting apparatus.

FIGS. 3 and 7 show the circuit design of the power supply 46 of the disconnecting apparatus 30. The power supply 46 is used to charge the capacitor C9 as an energy store and to protect against a switching overvoltage. The mechanical switch 38 is located between the switch or contact connections J1 and J2 (FIG. 2). As soon as the switch 38 opens the circuit, the arc LB forms. The arc voltage is rectified via diodes D1, D2 connected in current paths 40a and 40b of the semiconductor switches (power switches) T1 and T2 of the power electronics 40 and the free-wheeling diodes of the IGBTs T1 and T2.

The power supply 46 comprises a semiconductor switch in the form of an IGBT T7, the gate of which is charged via resistors R33 to R37. As soon as the gate-emitter potential of the thyristor T7 exceeds the threshold voltage, the IGBT T7 activates and the capacitor C9 is charged. An NPN transistor Q15 is connected to the IGBT T7 in the manner shown in FIG. 7. On the emitter side, the transistor Q15 is connected to ground via a Zener diode D19. If the potential of the capacitor C9 reaches the value of the Zener diode D19 plus the base-emitter threshold voltage of the transistor Q15, it becomes conductive and limits the gate-emitter voltage of the IGBT T7. This IGBT then begins to block, and the charging current of the capacitor C9 is interrupted. To protect the gate of the IGBT T7 and the transistor Q15 from overvoltage, a Zener diode D19 is inserted on the base gate side of the semiconductor switches T7 and Q15.

Figure 8:
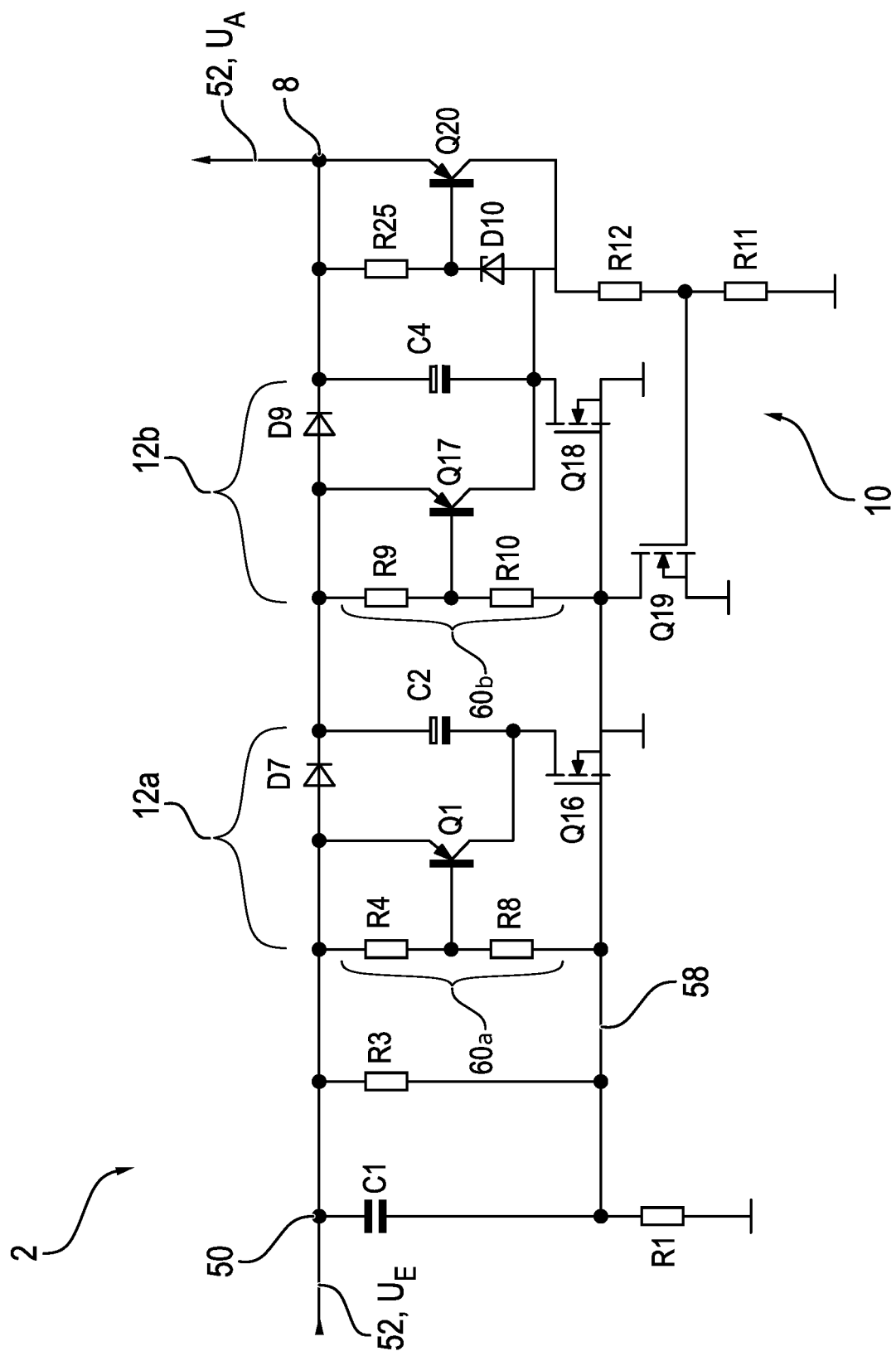
FIG. 8 shows the voltage multiplier as a component circuit of the hybrid disconnecting apparatus.

In order to reduce the switching delay time for short-circuiting the switching path or for extinguishing the arc LB, the voltage multiplier 2 shown in FIG. 8 is connected downstream of the power supply 46 in the connection 52. With the voltage multiplier 2 it is possible, for example, to convert a 5 V supply or input voltage, which is not sufficient to generate a control pulse P by means of which the IGBTs T1 and T2 may be securely controlled, into an output voltage of 15 V—which enables the IGBTs T1 and T2 to be securely controlled.

The voltage multiplier 2 is connected between the terminal connection 50 and the tap point 8 in the connection 52, and in this embodiment has two voltage stages 12a and 12b. A capacitor C1 of the control unit 10 is connected to the terminal connection 50, which is connected to ground (reference potential) by means of a resistor R1. In this embodiment, the control unit 10 is implemented purely as circuitry. For this purpose, between the capacitor C1 and the resistor R1 a signal connection 58 is made, by means of which the voltage stages 12a and 12b may be controlled. A resistor R3 is connected between the connections 52 and 58, in parallel with the capacitor C1.

The voltage stage 12a comprises a (rectifier) diode D7, which is connected to ground in series with a (charging) capacitor C2 and with a transistor Q16 implemented as MOS-FET. A bipolar PNP transistor Q1 is connected in parallel with the diode D7 and the capacitor C2 and is connected on the gate side to a tap point of a voltage divider 60a which is formed by the resistors R4 and R8 connected between the connections 52 and 58.

Correspondingly, the voltage stage 12b has a series circuit made up of a diode D9, a capacitor C4 and a transistor Q18. A transistor Q17 is connected in parallel to the diode D9 and the capacitor C4, and is gated by two resistors R9 and R10 as a voltage divider 60b.

In this exemplary embodiment, the control unit 10 comprises a resistor R25 and a Zener diode D10 that are connected in parallel to the capacitor C4 in the manner shown in FIG. 8. Between the Zener diode D10 and the resistor R25, the control input of a bipolar PNP transistor Q20 is connected, which is connected to ground on the emitter side at the tap point 8 and to ground on the collector side by means of two resistors R12 and R11. A gate terminal of a transistor Q19, implemented as MOS-FET, is connected between the resistors R12 and R11. The transistor Q19 is connected to ground on the source side and is connected to the signal line 58 via the drain terminal; the drain terminal is connected between the gate terminal of the transistor Q18 and the source terminal of the transistor 16 [sic]. Initially, the capacitors C1 and C2 as well as C4 are uncharged and the transistors Q16 and Q18 as well as Q1 [sic] and Q17 are in an electrically non-conductive state. If an input voltage is applied to the terminal connection 50 by the power supply 46, a current flows through the capacitor C1. As a result, the gates of the transistors Q16 and Q18 are charged. The transistors Q16 and Q18 then switch through, charging the capacitor C2 via the diode D7 and the capacitor C4 via the diodes D7 and D9, with a respective individual voltage.

When the individual voltage or charging voltage of the capacitor C4 of the voltage stage 12b reaches a given value, the Zener diode D10 enables a current flow through the resistor R25. When the voltage drop across resistor R25 rises to, for example, 0.7 V, the Q20 transistor switches through. As a result, a voltage is applied to the gate of the transistor Q19, which is limited by the voltage divider formed by the resistors R12 and R11. The transistor Q19 then switches through and pulls the gates of the transistors Q16 and Q18 to ground, so that these transistors are blocked and the charging process of the capacitors C2 and C4 is terminated.

As a result of the transistor Q19 being switched through, an electric current flows through the series circuits of the resistors R4 and R8 as well as the resistors R9 and R10, or through the voltage dividers 60a and 60b. Due to the voltage drops across resistors R4 and R9, PNP transistors Q1 and Q17 are switched through. The diodes D7 and D9 prevent discharge of the capacitors C2 and C4. Thus the capacitors C2 and C4 are effectively connected in series along the connection 52. This generates an output voltage at the tap point 8 that consists of the input voltage at the terminal connection 50 plus the charging or individual voltages of the capacitors C2 and C4.

The invention is not limited to the exemplary embodiments described above. Rather, other variants of the invention may also be derived from it by the skilled person without departing from the subject matter of the invention. In particular, all the individual features described in connection with the exemplary embodiments may also be combined together in other ways without departing from the subject matter of the invention.

The following is a summary list of reference numerals and symbols and the corresponding structure used in the above description of the invention:

2 Voltage multiplier
4 Terminal connection/positive pole
6 Terminal connection/negative pole
8 Tap point
10 Control unit
12, 12a, 12b Voltage stage
14 Line
16 Series circuit
18 Rectifier diode
20 Charging capacitor
22, 24 Semiconductor switches
26, 28 Signal line
30 Disconnecting apparatus
32 DC source/photovoltaic generator
34 Device/inverter
36 Main current path
38 Switch contact/switch
40 Power electronics
42 Pulse generator
44 Protective circuit
46 Power supply
48 Feedback line
50 Terminal connection
52 Connection
54 Voltage tap
56 Driver stage
58 Signal connection
60a, 60b Voltage divider
$U_E$ Input voltage
$U_A$ Output voltage
$U_G$ Reference potential
$U_Z$ Individual voltage
LB Electric arc
J1, J2 Switch connection
P Control pulse

The invention claimed is:

1. A method for converting an input voltage into an output voltage that is increased in comparison to the input voltage, the method comprising:

providing a plurality of voltage stages each having a series circuit connected to a reference potential and including a rectifier diode, a charging capacitor, and a switchable first semiconductor switch; a capacitor preceding the plurality voltage stages on an input side, in a charged state, causing the first semiconductor switches of the plurality voltage stages to close; and each of the voltage stages having a switchable second semiconductor switch connected in parallel with the rectifier diode and the charging capacitor, and the rectifier diodes of mutually adjacent voltage stages being connected in series;

closing the first semiconductor switches and opening the second semiconductor switches, to thereby charge the charging capacitors of the plurality voltage stages by way of the input voltage; and subsequently opening the first semiconductor switches and closing the second semiconductor switches, to sum individual voltages generated in the charging capacitors over the series-connected rectifier diodes and to produce the output voltage.

2. A voltage multiplier, the voltage multiplier comprising:

a plurality of voltage stages each having a series circuit connected to a reference potential, the series circuit including a rectifier diode, a charging capacitor, and a first semiconductor switch that is switchable by a control unit, wherein the control unit is configured to control at least one voltage stage that provides an individual voltage;

said control unit including a capacitor preceding said plurality voltage stages on an input side, said capacitor of said control unit, in a charged state, causing said first semiconductor switches of said plurality voltage stages to close;

each voltage stage having a second semiconductor switch connected to and switchable by said control unit, said second semiconductor switch being connected in parallel with said rectifier diode and said charging capacitor; and said rectifier diodes of adjacent voltage stages being connected in series; and wherein said control unit is configured to:

first close said first semiconductor switches and open said second semiconductor switches, to thereby charge said charging capacitors of said plurality voltage stages by way of the input voltage; and next, open said first semiconductor switches and close said second semiconductor switches, to sum individual voltages generated in said charging capacitors over said series-connected rectifier diodes and to produce the output voltage.

3. The voltage multiplier according to claim 2, configured for a disconnecting apparatus for interrupting direct current.

4. The voltage multiplier according to claim 2, wherein said control unit includes a Zener diode connected in parallel with said charging capacitor and said second semiconductor switch of a last voltage stage on an output side, and wherein, when the charging capacitor is charged, the Zener diode gates a third semiconductor switch in such a way as to open said first semiconductor switches of said plurality voltage stages.

5. The voltage multiplier according to claim 2, further comprising a voltage divider connected in parallel with said series circuit, for controlling said second semiconductor switch of a respective said voltage stage.

6. The voltage multiplier according to claim 2, wherein:
 said first semiconductor switch is a MOS-FET with a drain connected to said charging capacitor and a source connected to the reference potential; and
 said second semiconductor switch is a bipolar transistor connected in parallel along a collector-emitter path of said rectifier diode and said charging capacitor and said bipolar transistor has a base connected to a gate terminal of said first semiconductor switch.

7. A disconnecting apparatus for interrupting direct current between a DC source and an electrical device, the disconnecting apparatus comprising:
 a current-carrying mechanical switch and power electronics connected to said switch;
 a power supply to be charged by an arc voltage generated when said switch opens and forms an electric arc;
 a pulse generator connected to said power supply and configured to control at least one semiconductor switch of said power electronics to cause said power electronics to short-circuit said switch while extinguishing the arc; and
 a voltage multiplier according to claim 2 connected between said power supply and said pulse generator.

8. The disconnecting apparatus according to claim 7, wherein said voltage multiplier has an input side connected to an energy storage device of said power supply.

9. The disconnecting apparatus according to claim 7, wherein said pulse generator comprises a semiconductor switch connected to an output of said voltage multiplier and connected upstream of a voltage tap, and wherein said semiconductor switch of said pulse generator is gated into conduction when an output voltage of said voltage multiplier reaches a given operating voltage.

10. The disconnecting apparatus according to claim 9, wherein the output voltage is a predetermined voltage or is a set voltage.

11. The disconnecting apparatus according to claim 9, wherein said power electronics on a gate side taps a control pulse generated from the output voltage of said voltage multiplier at a voltage tap of said pulse generator.

* * * * *